United States Patent
Wu

(10) Patent No.: US 9,424,912 B2
(45) Date of Patent: Aug. 23, 2016

(54) STATIC RAM

(71) Applicant: SOCIONEXT INC., Yokohama-shi, Kanagawa (JP)

(72) Inventor: Wenhao Wu, Kokubunji (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/721,343

(22) Filed: May 26, 2015

(65) Prior Publication Data

US 2015/0380081 A1  Dec. 31, 2015

(30) Foreign Application Priority Data

Jun. 27, 2014 (JP) .................................. 2014-132691

(51) Int. Cl.
| | |
|---|---|
| *G11C 11/419* | (2006.01) |
| *G11C 11/41* | (2006.01) |
| *G11C 11/413* | (2006.01) |
| *G11C 7/10* | (2006.01) |
| *G11C 7/12* | (2006.01) |

(52) U.S. Cl.
CPC ............ *G11C 11/419* (2013.01); *G11C 7/1096* (2013.01); *G11C 7/12* (2013.01); *G11C 11/41* (2013.01); *G11C 11/413* (2013.01)

(58) Field of Classification Search
CPC .... G11C 11/41; G11C 11/413; G11C 11/419; G11C 7/1096; G11C 7/12
See application file for complete search history.

(56) References Cited

U.S. PATENT DOCUMENTS

| | | | | |
|---|---|---|---|---|
| 7,486,540 | B2* | 2/2009 | Gouin .................. | G11C 11/419 365/154 |
| 7,701,783 | B2 | 4/2010 | Yamagami | |
| 8,072,823 | B2 | 12/2011 | Aihara et al. | |
| 9,070,432 | B2* | 6/2015 | Hsieh ........................ | G11C 7/12 |
| 2011/0069574 | A1* | 3/2011 | Hirabayashi ......... | G11C 11/413 365/226 |
| 2012/0287733 | A1* | 11/2012 | van Winkelhoff ....... | G11C 7/02 365/189.16 |
| 2015/0325313 | A1* | 11/2015 | Badereddine ........ | G11C 11/419 365/154 |

FOREIGN PATENT DOCUMENTS

| | | |
|---|---|---|
| JP | 2009-151847 A | 7/2009 |
| JP | 2010-257554 A | 11/2010 |
| JP | 2013-246862 A | 12/2013 |

* cited by examiner

*Primary Examiner* — Vanthu Nguyen

(74) *Attorney, Agent, or Firm* — Arent Fox LLP

(57) ABSTRACT

A static RAM includes: a plurality of memory cells provided at intersections of bit line pairs and word lines; a write driver connected between a high potential power source line and a drive line; a column switch including a first transistor pair which connects one of the plurality of bit line pairs to the write driver; and a boost circuit which boosts the drive line to a negative potential, wherein the boost circuit includes: a capacitive element one terminal of which is connected to the drive line, and to the other terminal of which a boost signal is applied; and a boost control transistor connected between the drive line and a reference potential power source line, the boost signal is applied to a gate of the boost control transistor, and the threshold value of the boost control transistor is lower than the threshold value of the first transistor pair.

6 Claims, 6 Drawing Sheets

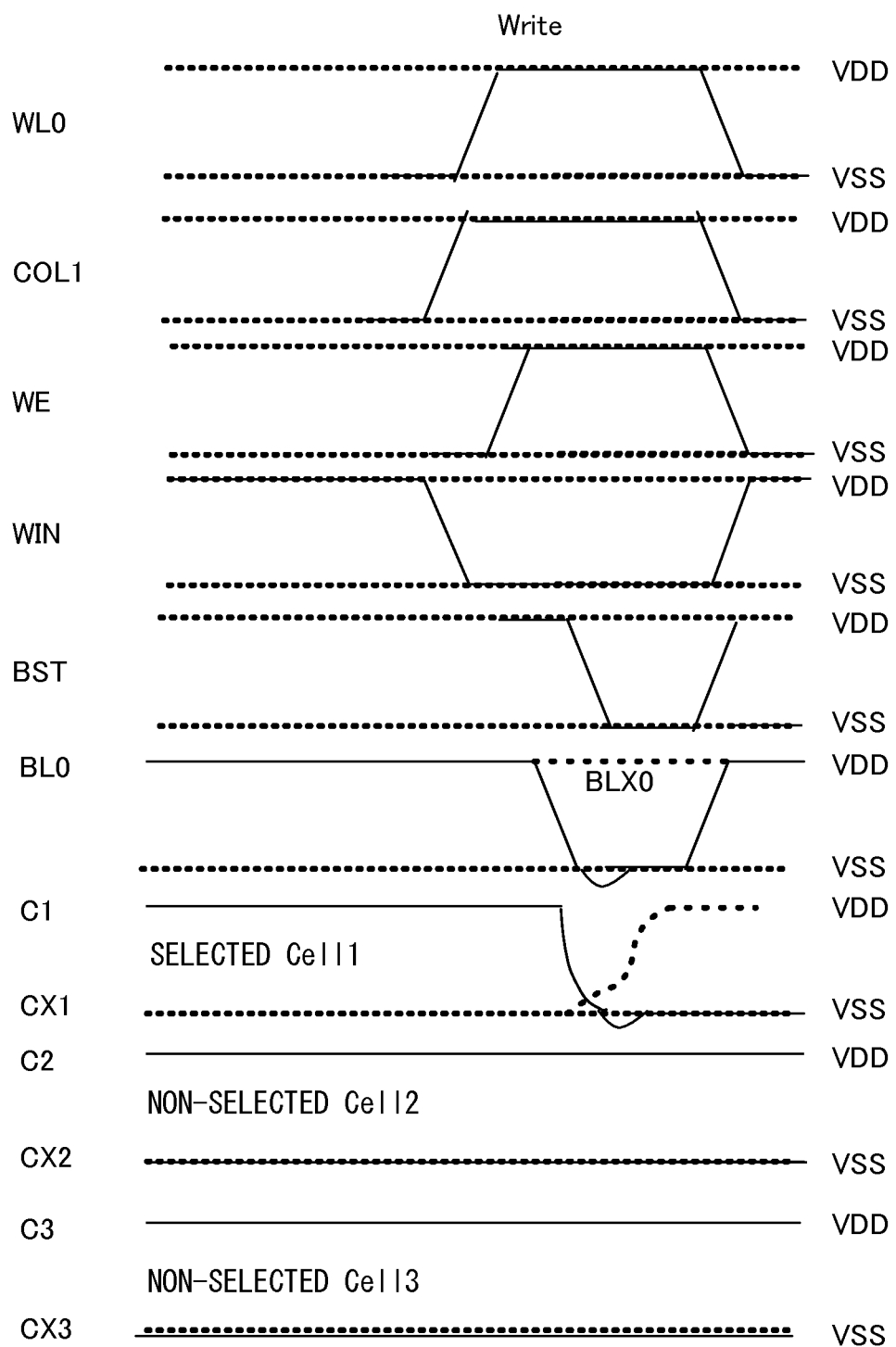

TO NVS NODE

TO NVS NODE
TO BST NODE

TO NVS NODE

STATIC RAM

CROSS-REFERENCE TO RELATED APPLICATION

This application is based upon and claims the benefit of priority of the prior Japanese Patent Application No. 2014-132691, filed on Jun. 27, 2014, the entire contents of which are incorporated herein by reference.

FIELD

The present invention relates to a static RAM (SRAM: Static Random Access Memory).

BACKGROUND

In recent years, as miniaturization of the semiconductor process has advanced, designing an SRAM that has a small area and which operates on a low operation voltage is progressing. As a result, the stability of a memory cell is reduced. In order to solve this problem, the stability at the time of write is secured by boosting the potential of a bit line of a bit line pair, whose potential is to be reduced, to a negative (minus) potential at the time of the write operation.

A write driver is generally formed by an inverter connected between a high potential power source line and a reference potential power source line. In order to boost the bit line to a negative potential, the reference potential power source line of the inverter forming the write driver is set as an independent low-side drive line, the low-side drive line is temporarily set to a negative potential at the time of the write operation, and in other cases, the low-side drive line is set to the same potential as that of the reference potential power source line.

In order to enable the above operation, a capacitive element and a boost control transistor are provided. One terminal of the capacitive element is connected to the low-side drive line. A boost signal is applied to the other terminal of the capacitive element. The boost control transistor is connected between the low-side drive line and the reference potential power source line. The boost signal is applied to a gate of the boost control transistor. At the normal time, the boost signal is at the high level and the boost control transistor turns on, the potential of the low-side drive line becomes a potential VSS of the reference potential power source line, and the capacitive element is charged to the potential difference between the potential of the boost signal and the VSS. At the time of the write operation, if the boost signal changes to the low level, the boost control transistor turns off and the potential of the low-side drive line changes to a negative potential by the charges charged in the capacitive element. The low-side drive line is connected to a bit line, which is driven to the low side, of a plurality of bit line pairs (column) via a transistor, etc. forming an inverter of the write driver, and the bit line which is driven to the low side is driven to a negative potential.

In the SRAM circuit as described above, the potential difference caused by the boosting differs depending on the variations in the operation voltage, the process conditions, etc. For example, in the case where the operation voltage of the boost signal is high, the low-side drive line changes to a large negative potential. In response to this, if the potential of the bit line of the selected bit line pair, which is driven to the low side, also changes to a large negative potential, there occurs a case where the threshold voltage of a transfer transistor of a non-selected memory cell is exceeded, and therefore, there has been a problem that data is written erroneously to the non-selected memory cell. Further, if the low-side drive line changes to a large negative potential, the voltage that is applied to the transistor of a non-selected column switch becomes higher than the threshold voltage, and therefore, the transistor of the non-selected column switch turns on, and a result there has been a problem that data is written erroneously to the non-selected cell.

In order to solve the problem of an over-boost as described above, Patent Document 1 has disclosed a clamp circuit that clamps the potential of the low-side drive line.

Further, Patent Document 2 has disclosed a configuration for controlling a potential difference that is boosted by using a variable capacitor as a capacitive element.

RELATED DOCUMENTS

[Patent Document 1] Japanese Laid Open Patent Document No. 2009-151847
[Patent Document 2] Japanese Laid Open Patent Document No. 2010-257554
[Patent Document 3] Japanese Laid Open Patent Document No. 2013-246862

SUMMARY

According to a first aspect, a static RAM includes: a plurality of word lines; a plurality of bit line pairs; a plurality of memory cells provided at intersections of the plurality of bit line pairs and the plurality of word lines; a write driver connected between a high potential power source line, whose potential is higher than a reference potential, and a drive line; a column switch including a first transistor pair which connects one of the plurality of bit line pairs, which is selected, to the write driver; and a boost circuit which boosts the drive line of the write driver to a negative potential, which is a potential lower than the reference potential, at a time of write of a memory cell of the plurality of memory cells, wherein the boost circuit includes: a capacitive element one terminal of which is connected to the drive line, and to the other terminal of which a boost signal is applied; and a boost control transistor connected between the drive line and a reference potential power source line whose potential is the reference potential, and to a gate of the boost control transistor the boost signal is applied, and a threshold value of the boost control transistor is lower than a threshold value of the first transistor pair.

According to a second aspect, a static RAM includes: a plurality of word lines; a plurality of bit line pairs; a plurality of memory cells provided at intersections of the plurality of bit line pairs and the plurality of word lines; a write driver connected between a high potential power source line whose potential is higher than a reference potential, and a drive line; a column switch including a first transistor pair which connects one of the plurality of bit line pairs, which is selected, to the write driver; and a boost circuit which boosts the drive line of the write driver to a negative potential, which is a potential lower than the reference potential, at a time of write of a memory cell of the plurality of memory cells, wherein the boost circuit includes: a capacitive element one terminal of which is connected to the drive line, and to the other terminal of which a boost signal is applied; a boost control transistor connected between the drive line and a reference potential power source line whose potential is the reference potential, and to a gate of the boost control transistor the boost signal is applied; and an over-boost limitation transistor connected between the drive line and the reference potential power source line, and a threshold value of the over-boost limitation transistor is lower than a threshold value of the first transistor pair.

The object and advantages of the embodiments will be realized and attained by means of the elements and combination particularly pointed out in the claims.

It is to be understood that both the foregoing general description and the following detailed description are exemplary and explanatory and are not restrictive of the invention.

BRIEF DESCRIPTION OF THE DRAWINGS

FIG. 5 is a time chart illustrating the write operation of the SRAM of the first embodiment; FIG. 6A illustrates a configuration and FIG. 6B to FIG. 6D illustrate specific examples of an over-boost prevention circuit.

DESCRIPTION OF EMBODIMENTS

Before explaining the static RAM (hereinafter, referred to as SRAM) of the embodiment, a general static RAM that boosts the low-side drive line of a write driver to a negative potential at the time of the write operation is explained.

Figure 1:
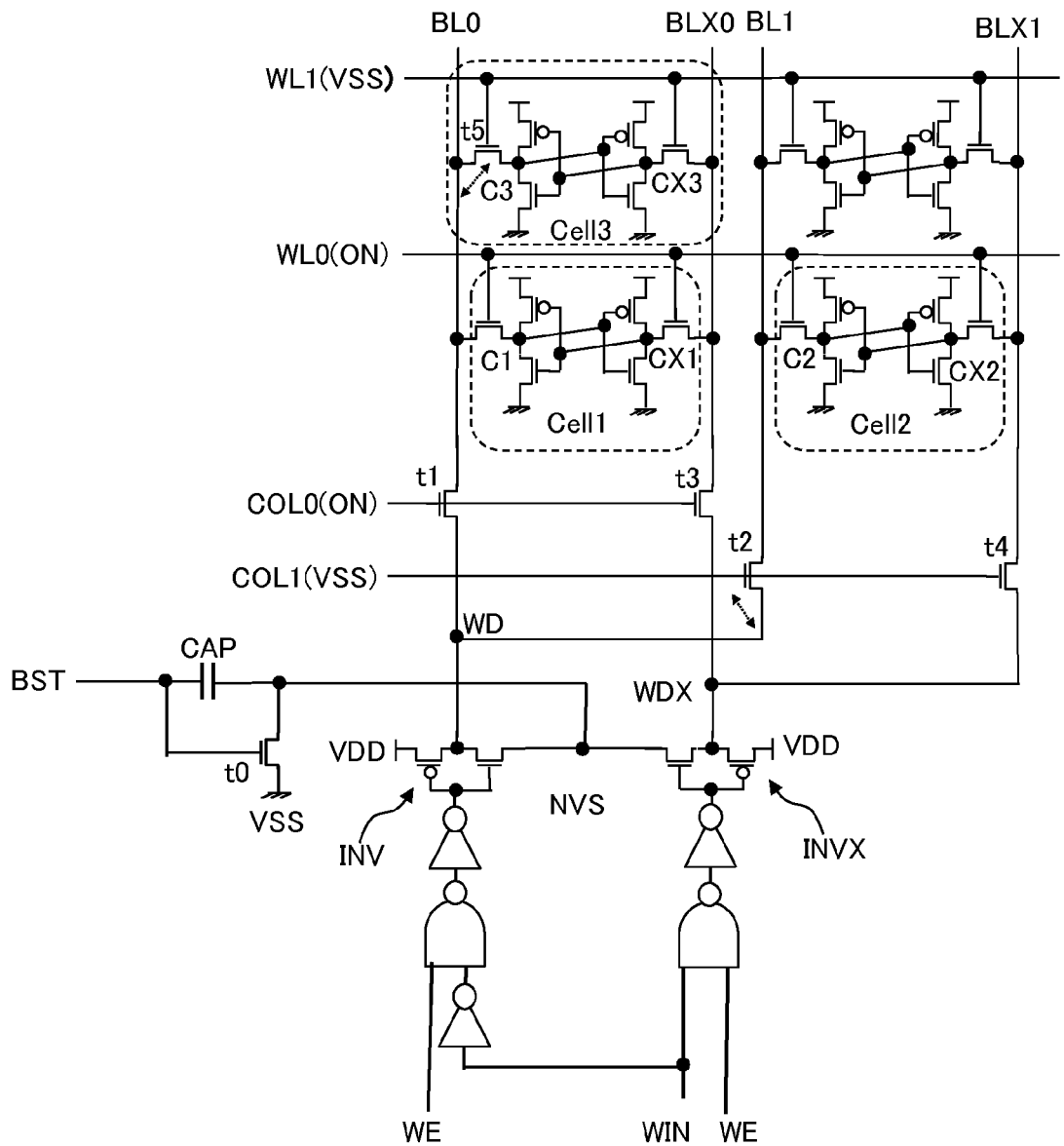
FIG. 1 is a diagram illustrating a configuration of the portions of a memory array, column switches, and a write driver of the SRAM.

FIG. 1 is a diagram illustrating a configuration of the portions of a memory array, column switches, and a write driver of the SRAM. In FIG. 1, a 2×2 memory array is illustrated as an example, but in fact, a large number of memory cells are arranged.

The SRAM has two word lines WL0 and WL1, two bit line pairs, i.e., a pair of bit lines BL0 and BLX0 and a pair of bit lines BL1 and BLX1, and four memory cells Cell1 to Cell4 arranged in correspondence to the intersections of the two word lines and the two bit line pairs. The memory cell has two inverters whose inputs and outputs are connected alternately and two transfer transistors that connect the connection nodes of the inverters to the bit line pairs.

The write driver has a first inverter INV that drives one of the bit line pair, i.e., BL0, and one of the other bit line pair, i.e., BL1, and a second inverter INVX that drives the other of the bit line pair, i.e., BLX0, and the other of the other bit line pair, i.e., BLX1. The first and second inverters are connected between a high potential power source line VDD and a drive power source line NVS. The potential of the high potential power source line VDD is represented by VDD, the potential of the reference potential power source line VSS, to be described later, is represented by VSS, and the potential of the drive power source line NVS is represented by NVS.

In the first and second inverters, when a write enable signal WE is at the low level (L), the PMOS transistor turns on and turns write signal lines WD and WDX to the H level. When the write enable signal WE is at the high level (H), in accordance with write data WIN, one of the transistors of the first and second inverters turns on and the other turns off. For example, when the WIN is at the L level, in the second inverter, the PMOS transistor turns on and the NMOS transistor turns off, and in the first inverter, the PMOS transistor turns off and the NMOS transistor turns on. Due to this, the WDX turns to the H level (VDD) and the WD turns to the L level (NVS). When the WIN is at the H level, in the second inverter, the PMOS transistor turns off and the MMOS transistor turns on, and in the first inverter, the PMOS transistor turns on and the NMOS transistor turns off. Due to this, the WDX turns to the L level (NVS) and the WD turns to the H level (VDD).

One of the bit line pair, i.e., BL0, and one of the other bit line pair, i.e., BL1, are connected to the write signal line WD via column switches t1 and t2, respectively, and the other of the bit line pair, i.e., BLX0, and the other of the other bit line pair, i.e., BLX1, are connected to the write signal line WDX via column switches t3 and t4, respectively. To the gates of the column switches t1 and t3, a column selection signal COL0 is applied, and to the gates of the column switches t2 and t4, a column selection signal COL1 is applied.

The configuration of the SRAM is widely known, and therefore, explanation is omitted.

In recent years, there is a tendency for the operation voltage of the SRAM to become lower and the stability of the operation to be improved by boosting the potential of the bit line that is driven to the low side to a negative potential at the time of the write operation. In the circuit in FIG. 1, the WD and WDX turn to the NVS at the time of the L level, but the NVS is turned to a negative potential lower than the VSS at the time of the write operation. Because of this, a capacitive element CAP one terminal of which is connected to the NVS, and to the other terminal of which, a boost signal BST is applied, and an NMOS transistor (boost control transistor) t0 that is connected between the NVS and VSS, and to the gate of which, the boost signal BST is applied are provided.

At the normal time, the boost signal BST is at the high level, the t0 turns on, the potential of the NVS and that of the VSS become the same, and the capacitive element CAP is changed to the potential difference between the boost signal BST and VSS. At the time of the write operation, if the boost signal changes to the low level (e.g., VSS), the t0 turns off and by the voltage charged across the capacitive element CAP, the potential of the NVS changes to a negative potential.

As described above, the NVS is connected to one of the WD and WDX, and one of the WD and WDX is connected to one of the bit line pair, respectively, which is selected, via the selected column switches. Due to this, one bit line of the selected bit line pair, which is driven to the low side, changes to a negative potential, and the negative potential is applied to the memory cell via the transfer gate of the selected memory cell and it is made possible to perform writing stably.

Figure 2:
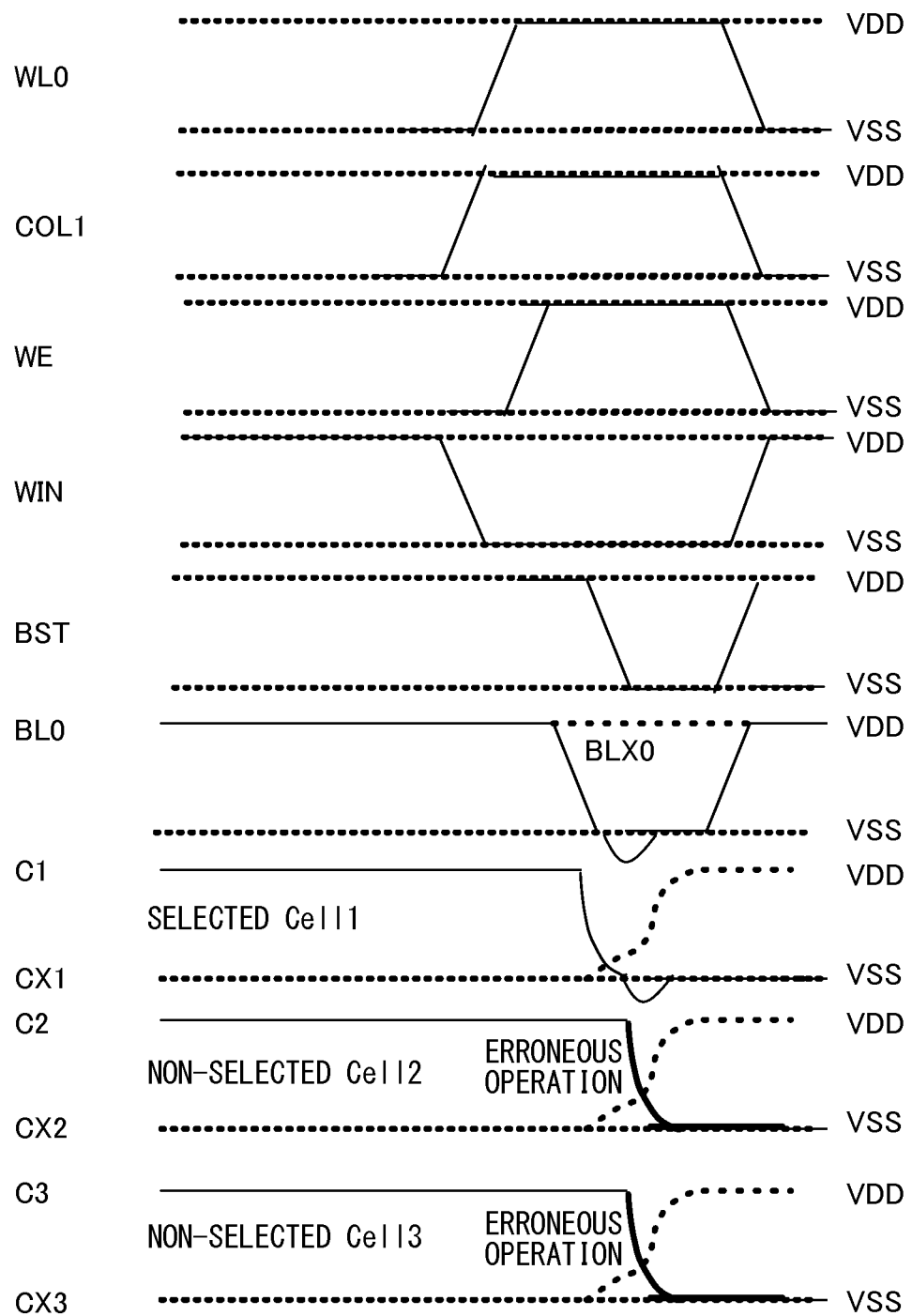
FIG. 2 is a time chart illustrating the write operation of the SRAM in FIG. 1.

FIG. 2 is a time chart illustrating the write operation of the SRAM in FIG. 1.

An example in which the WL0 turns on, the COL0 turns on, the Cell1 is accessed, and WIN=L is written as illustrated in FIG. 1 is illustrated.

As illustrated in FIG. 2, the WIN changes to L, the COL0 and WL0 change to H, and the BL0 changes to L. Further, when the BL0 begins to change to L, the BST changes from H to L, and the boost functions and the BL0 changes to a negative potential. At this time, the BLX0 maintains H.

A node CX of the Cell1 changes to L in accordance with the change of the BL0 and further changes to a negative potential. Another node CX1 of the Cell1 changes to H in accordance with the change of BLX0. Due to this, L is written to the Cell1.

At this time, as illustrated in FIG. 1, a transfer gate t5 of the Cell3 turns off because the WL1 is at L and the column switches t2 and t4 are off because the COL1 is at L. If the NVS is boosted to a negative potential and the BL 0 changes to a negative potential, there occurs a case where a potential difference between the WL 1 at the L level and the BL 0 at a negative potential exceeds the threshold voltage of the t5. Due to this, the t5 turns on and erroneously writes data to the Cell3, which is the non-selected cell, and therefore, an erroneous write in which the date of the Cell13 is rewritten occurs.

Further, when the WD changes to a negative potential, there occurs a case where the potential difference between the COL 1 at the L level and the WD exceeds the threshold voltage of the t2. Due to this, the t2 turns on and the non-selected column turns on, and an erroneous write in which data is written erroneously to the non-selected cell Cell12 occurs.

In the embodiment explained below, the SRAM that prevents an erroneous write by means of a simple circuit is disclosed.

Figure 3:
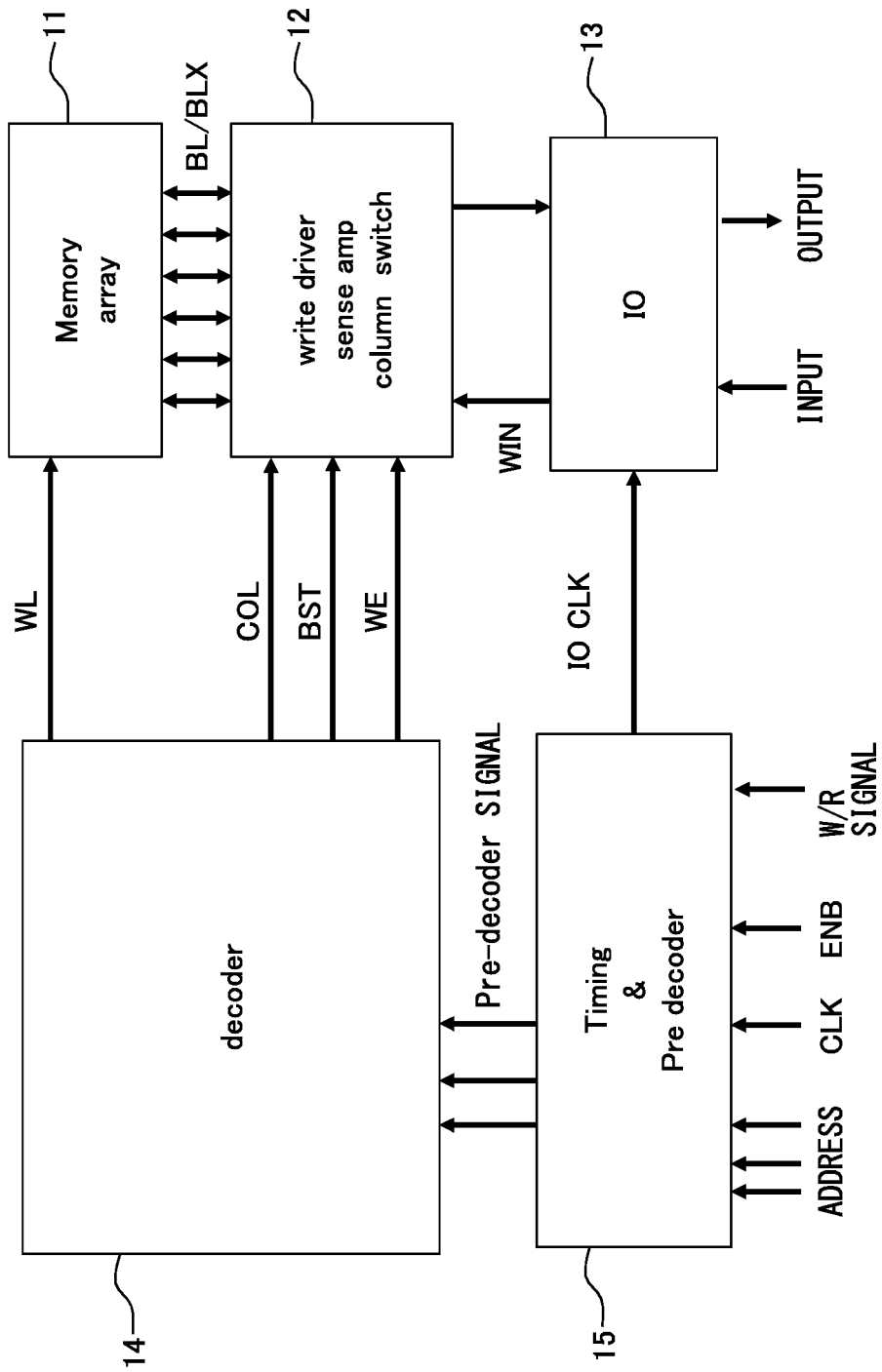
FIG. 3 is a diagram illustrating the general configuration of the SRAM of the embodiment.

FIG. 3 is a diagram illustrating the general configuration of the SRAM of the embodiment.

The SRAM has a memory array 11, a portion 12 including a write driver, a sense amplifier, and a column switch, an input/output unit 13, a decoder 14, and a timing and pre-decoder unit 15. The memory array 11 includes a plurality of word lines, a plurality of bit line pairs, and a plurality of memory cells arranged in correspondence to the intersections of the plurality of word lines and the plurality of bit line pairs. The input/output unit (IO) 13 receives write data from the outside and generates the WIN, and generates read data from an output of the sense amplifier and outputs the read data to the outside. The decoder 14 decodes a pre-coded address signal and generates a word line selection signal WL, decodes a pre-coded address signal and generates a column selection signal, and further, generates the write enable signal WE, the boost signal BST, etc. The timing and pre-decoder unit 15 performs total timing control and at the same times, pre-decodes an address signal.

The general configuration of the SRAM in FIG. 3 is widely known, and therefore, explanation is omitted.

Figure 4:
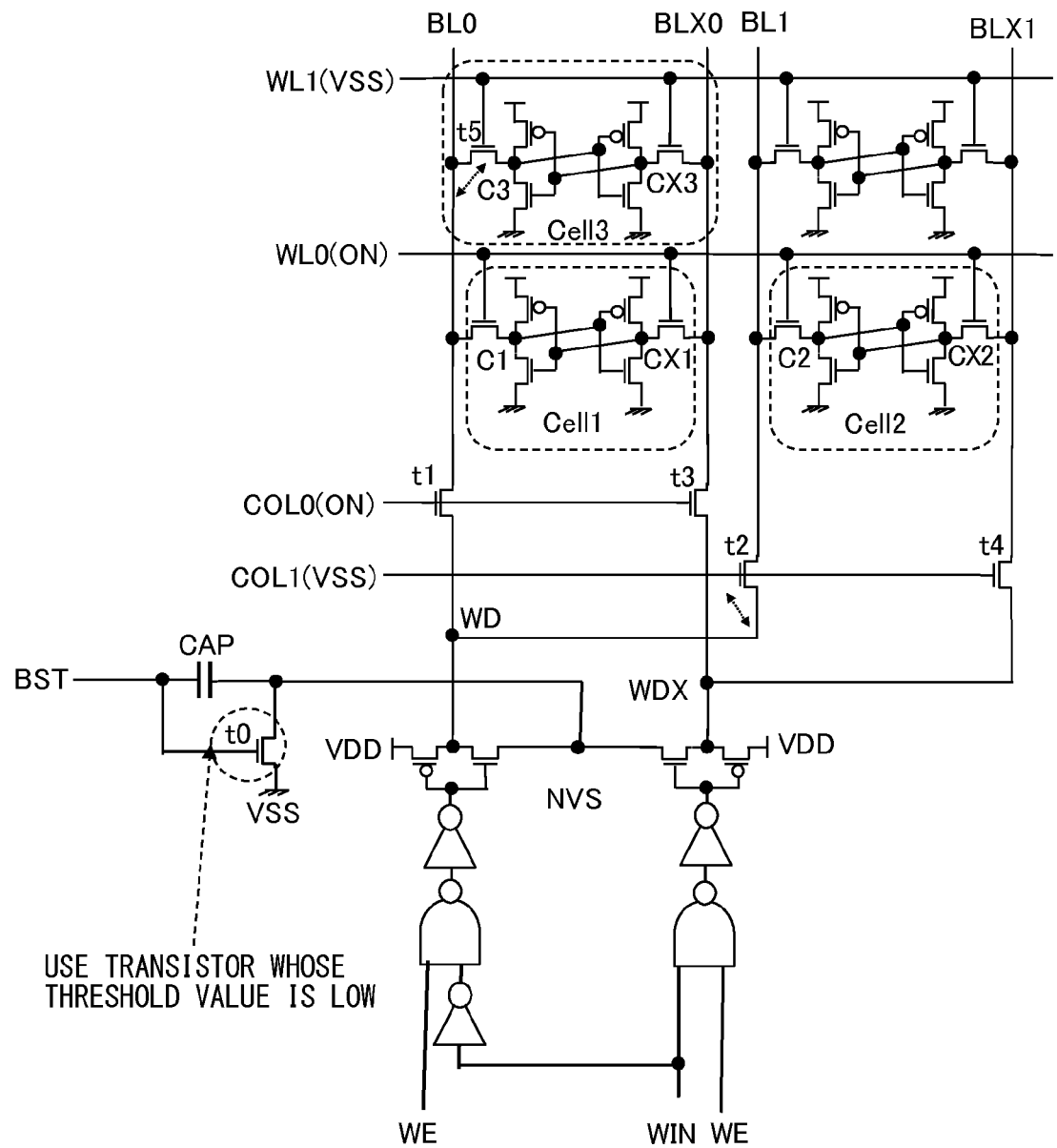
FIG. 4 is a diagram illustrating a configuration of the portion of a memory array, column switches, and a write driver of an SRAM of a first embodiment.

FIG. 4 is a diagram illustrating a configuration of the portion of a memory array, column switches, and a write driver of an SRAM of a first embodiment. In FIG. 4, a 2×2 memory array is illustrated as an example, as in FIG. 1, but in fact, a number of memory cells are arranged.

As illustrated in FIG. 4, the SRAM of the first embodiment has a configuration similar to that of the SRAM in FIG. 1, and only the characteristics of the boost control transistor t0 are different from those of the SRAM in FIG. 1. Because of this, explanation of each part is omitted and only portions different from those of the SRAM in FIG. 1 are explained.

In the SRAM of the first embodiment, the boost control transistor t0 is a transistor whose threshold value is low. Specifically, the threshold voltage of the boost control transistor t0 is lower than the threshold voltage of the transistor forming the transfer gate included in the memory cell and the transistor forming the column switch.

Due to this, in FIG. 4, before the potential difference between the gate of the NMOS transistor t5 forming the transfer gate of the non-selected memory cell Cell3 that is connected to the selected bit line pair, and the BL0 exceeds the threshold voltage of the t5, the t0 turns on. Because of this, charges are supplied from the VSS to the NVS node and the negative potential of the NVS node is mitigated. Due to this, it is possible to prevent an erroneous write to the Cell3 by limiting an over-boost of the NVS node.

This is also true in the case where the potentials of the WDX and BLX0 are changed to the potential of the NVS node, and the threshold voltage of the t0 is made lower than the threshold voltage of the transistor forming the transfer gate of the memory cell and the transistor forming the column switch.

Similarly, before the potential difference between the gate of the non-selected column switch t2 and the WD node exceeds the threshold voltage of the transistor forming the t2, the t0 turns on and the negative potential of the NVS node is mitigated. Due to this, it is possible to prevent an erroneous write to the Cell2.

In other words, an erroneous write occurs when the non-selected signal (VSS) is applied to the gate, the potential difference in a critical transistor in which a boosted negative potential is applied to an uncontrolled terminal exceeds the threshold voltage, and the transistor turns on. Because of this, if the boost control transistor t0 that is connected between the node of the non-selected signal (VSS) and the NVS node at the boosted negative potential turns on before the critical transistor turns on, it is possible to prevent an erroneous write.

A specific example of the threshold voltage is explained, but the example that is explained is merely an example and the threshold voltage should be appropriately set in accordance with the design of the memory array.

For example, as the VDD, usually a voltage of about 1.2 V is used, but in terms of specifications, the memory array is required to operate even in the case where the VDD is 0.6 V. Because of this, the threshold value of the transistors of the memory array, such as the t1 to t4 and t5, is designed to about 400 mV and the boost signal is designed to change from the VDD to the VSS (0 V). For example, in the case where it is designed so that the VDD is 0.6 V and the potential of the node NVS is boosted by about −60 mV to −100 mV, if the VDD is 1.2 V, there occurs a case where the potential of the node NVS is boosted to −500 mV or more including variations, etc., in manufacture. In this case, the potential different at the time of write exceeds the threshold voltage of the t1 to t4 and t5 and an erroneous write occurs. Because of this, by setting the threshold voltage of the t0 to 150 mV to 200 mV, it is possible to prevent the occurrence of an erroneous write. The threshold voltage of the t0 can be implemented by changing the other portions and process conditions or the shape of the transistor.

FIG. 5 is a time chart illustrating the write operation of the SRAM of the first embodiment.

As illustrated in FIG. 5, the SRAM of the first embodiment performs the operation similar to that illustrated in FIG. 2, but differs from the operation in FIG. 2 in that an erroneous write does not occur in the Cell2 and Cell3. The BL0 and WD, although the WD is not illustrated, do not fall to the negative potential at which the t5 and t2 turn on, and therefore, an erroneous write does not occur in the Cell2 and Cell3.

As explained above, the SRAM of the first embodiment can prevent the NVS node from being over-boosted to a negative potential only by changing the threshold voltage of the boost control transistor t0, and therefore, an erroneous write is prevented. Consequently, it is not necessary to add the circuit as described in Patent Literatures 1 and 2 to the SRAM of the first embodiment, and therefore, the circuit configuration of the SRAM of the first embodiment is simple.

Figure 6A:
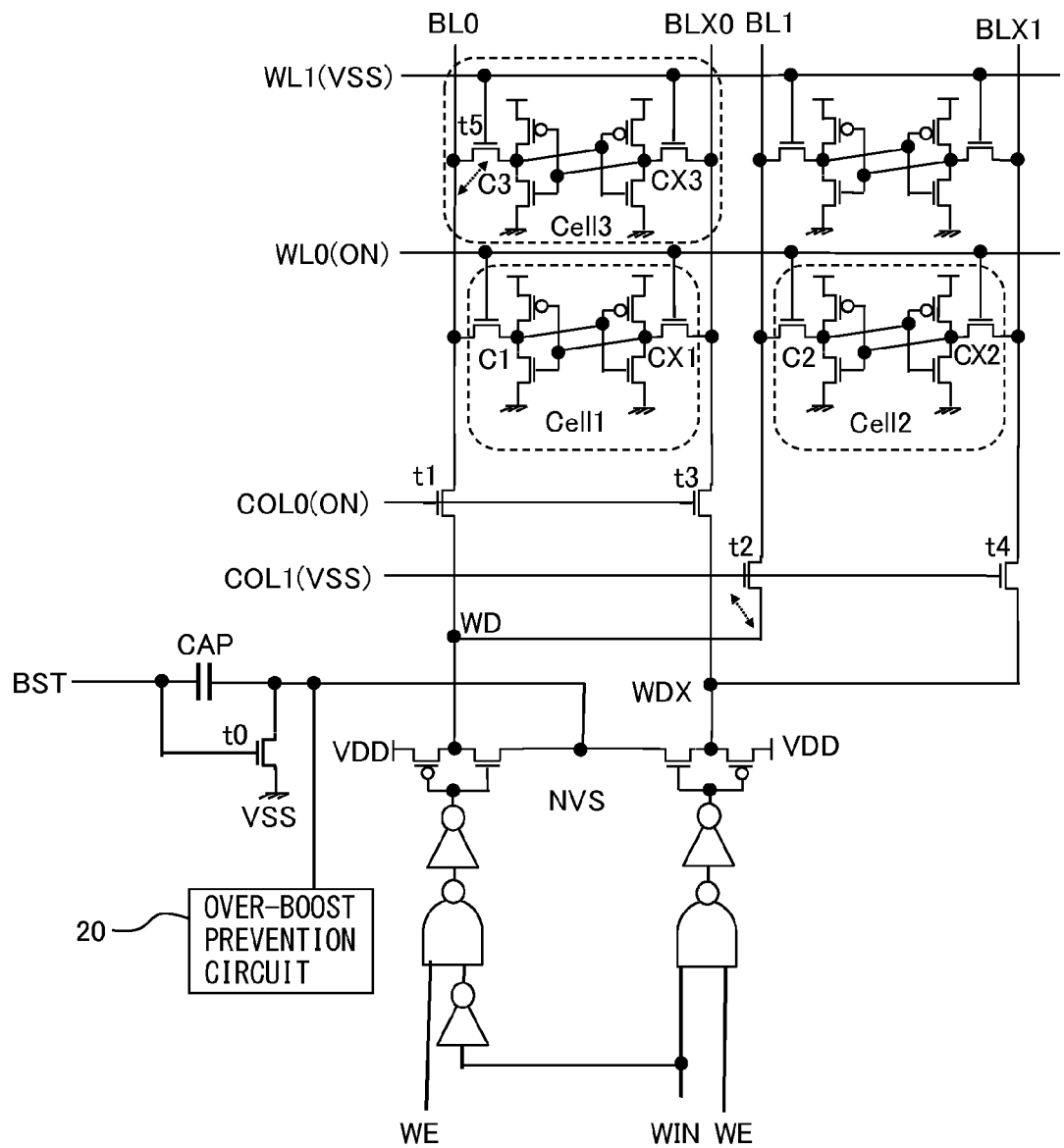
FIG. 6A to FIG. 6D are diagrams illustrating the configuration of the portions of a memory array, column switches, and a write driver of an SRAM of a second embodiment.
Figure 6B:
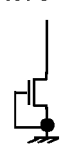
Figure 6C:
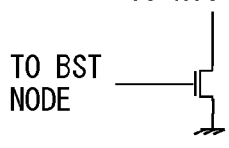
Figure 6D:
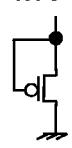

FIG. 6A to FIG. 6D are diagrams illustrating the configuration of the portions of a memory array, column switches, and a write driver of an SRAM of a second embodiment, and FIG. 6A illustrates a configuration and FIG. 6B to FIG. 6D illustrate specific examples of an over-boost prevention circuit. In FIG. 6A, as in FIG. 1, a 2×2 memory array is illustrated as an example, but in fact, a number of memory cells are arranged.

As illustrated in FIG. 6A, the SRAM of the second embodiment has a configuration similar to that of the SRAM illustrated in FIG. 1, but differs from the configuration in FIG. 1 in that an over-boost prevention circuit 20 is provided. Because of this, explanation of each unit is omitted and items different from those of the SRAM in FIG. 1 are explained.

It is possible to form the over-boost prevention circuit 20 by connecting an NMOS transistor between the node NVS and VSS and by applying the VSS to the gate as illustrated in FIG. 6B. In this case, the threshold voltage of the NMOS transistor is set to a voltage lower than the threshold voltage of the transistor forming the transfer gate of the memory cell and the threshold voltage of the transistor forming the column switch.

Further, it is possible to form the over-boost prevention circuit 20 by connecting an NMOS transistor between the node NVS and VSS and by applying the boost signal BST to the gate as illustrated in FIG. 6C. In this case, the threshold voltage of the NMOS transistor is set to a voltage lower than the threshold voltage of the transistor forming the transfer gate of the memory cell and the threshold voltage of the transistor forming the column switch.

Furthermore, it is possible to form the over-boost prevention circuit 20 by connecting a PMOS transistor between the node NVS and VSS and by applying the NVS to the gate as illustrated in FIG. 6D. In this case, the threshold voltage of the PMOS transistor is set to a voltage lower than the threshold voltage of the transistor forming the transfer gate of the memory cell and the threshold voltage of the transistor forming the column switch.

As explained above, in the SRAM of the second embodiment, it is possible to prevent the NVS node from being over-boosted to a negative potential by only providing the over-boost prevention circuit having a simple configuration, and therefore, an erroneous write is prevented. Consequently, to the SRAM of the second embodiment, only a circuit that is simple compared to the circuit to be added described in Patent Literatures 1 and 2 is added, and therefore, the circuit configuration is simple.

As described above, in the SRAM of the embodiment, it is possible to prevent an erroneous write to the non-selected cell only by changing the conventional transistor to a transistor whose threshold value is low or only by adding one transistor whose threshold value is low, and therefore, the write stability can be secured.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A static RAM comprising:
a plurality of word lines;
a plurality of bit line pairs;
a plurality of memory cells provided at intersections of the plurality of bit line pairs and the plurality of word lines;
a write driver connected between a high potential power source line, whose potential is higher than a reference potential, and a drive line;
a column switch including a first transistor pair which connects one of the plurality of bit line pairs, which is selected, to the write driver; and
a boost circuit which boosts the drive line of the write driver to a negative potential, which is a potential lower than the reference potential, at a time of write of a memory cell of the plurality of memory cells, wherein the boost circuit includes:
a capacitive element one terminal of which is connected to the drive line, and to the other terminal of which a boost signal is applied; and
a boost control transistor connected between the drive line and a reference potential power source line whose potential is the reference potential, and to a gate of the boost control transistor the boost signal is applied, and
a threshold value of the boost control transistor is lower than a threshold value of the first transistor pair.

2. The static RAM according to claim 1, wherein
each memory cell of the plurality of memory cells includes a second transistor pair that connects the each memory cell to the bit line pair, and
the threshold value of the boost control transistor is lower than a threshold value of the second transistor.

3. A static RAM comprising:
a plurality of word lines;
a plurality of bit line pairs;
a plurality of memory cells provided at intersections of the plurality of bit line pairs and the plurality of word lines, including a first transistor pair which is selected by the word line and which transfers data with the bit line pair;
a write driver connected between a high potential power source line, whose potential is higher than a reference potential, and a drive line;
a column switch which selects one of the plurality of bit line pairs and which connects the selected bit line pair to the write driver; and
a boost circuit which boosts the drive line of the write driver to a negative potential, which is a potential lower than the reference potential, at a time of write of a memory cell of the plurality of memory cells, wherein the boost circuit includes:
a capacitive element one terminal of which is connected to the drive line, and to the other terminal of which a boost signal is applied; and
a boost control transistor connected between the drive line and a reference potential power source line whose potential is the reference potential, and to a gate of the boost control transistor the boost signal is applied, and
a threshold value of the boost control transistor is lower than a threshold value of the first transistor pair.

4. A static RAM comprising:
a plurality of word lines;
a plurality of bit line pairs;
a plurality of memory cells provided at intersections of the plurality of bit line pairs and the plurality of word lines;
a write driver connected between a high potential power source line whose potential is higher than a reference potential, and a drive line;
a column switch including a first transistor pair which connects one of the plurality of bit line pairs, which is selected, to the write driver; and
a boost circuit which boosts the drive line of the write driver to a negative potential, which is a potential lower than the reference potential, at a time of write of a memory cell of the plurality of memory cells, wherein the boost circuit includes:
    a capacitive element one terminal of which is connected to the drive line, and to the other terminal of which a boost signal is applied;
    a boost control transistor connected between the drive line and a reference potential power source line whose potential is the reference potential, and to a gate of the boost control transistor the boost signal is applied; and
    an over-boost limitation transistor connected between the drive line and the reference potential power source line, and
a threshold value of the over-boost limitation transistor is lower than a threshold value of the first transistor pair.

5. The static RAM according to claim 4, wherein each memory cell of the plurality of memory cells includes a second transistor pair which connects the each memory cell to the bit line pair, and the threshold value of the over-boost limitation transistor is lower than a threshold value of the second transistor.

6. A static RAM comprising:
a plurality of word lines;
a plurality of bit line pairs;
a plurality of memory cells provided at intersections of the plurality of bit line pairs and the plurality of word lines, and including a first transistor pair which is selected by the word line and which transfers data with the bit line pair;
a write driver connected between a high potential power source line, whose potential is higher than a reference potential, and a drive line;
a column switch which selects one of the plurality of bit line pairs and which connects the selected bit line pair to the write driver; and
a boost circuit which boosts the drive line of the write driver to a negative potential, which is a potential lower than the reference potential, at the time of write of a memory cell of the plurality of memory cells, wherein the boost circuit includes:
    a capacitive element one terminal of which is connected to the drive line, and to the other terminal of which, a boost signal is applied;
    a boost control transistor connected between the drive line and a reference potential power source line whose potential is the reference potential, and to a gate of the boost control transistor the boost signal is applied; and
    an over-boost limitation transistor connected between the drive line and the reference potential power source line, and
a threshold value of the over-boost limitation transistor is lower than a threshold value of the first transistor pair.

* * * * *